US008729890B2

(12) United States Patent
Donovan et al.

(10) Patent No.: US 8,729,890 B2
(45) Date of Patent: May 20, 2014

(54) MAGNETIC ANGLE AND ROTATION SPEED SENSOR WITH CONTINUOUS AND DISCONTINUOUS MODES OF OPERATION BASED ON ROTATION SPEED OF A TARGET OBJECT

(75) Inventors: Mark J. Donovan, Derry, NH (US);
Ryan Metivier, Nashua, NH (US);
Michael C. Doogue, Manchester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 249 days.

(21) Appl. No.: 13/084,745

(22) Filed: Apr. 12, 2011

(65) Prior Publication Data
US 2012/0262155 A1    Oct. 18, 2012

(51) Int. Cl.
*G01B 7/30* (2006.01)
*G01B 7/14* (2006.01)

(52) U.S. Cl.
USPC ............... 324/207.25; 324/207.2; 324/167; 324/161; 324/251

(58) Field of Classification Search
USPC ............... 324/167, 207.2, 207.25, 161, 251
See application file for complete search history.

(56) References Cited

U.S. PATENT DOCUMENTS

| 4,668,914 | A | 5/1987 | Kersten et al. |
| 4,761,569 | A | 8/1988 | Higgs |
| 4,829,352 | A | 5/1989 | Popovic et al. |
| 5,027,648 | A * | 7/1991 | Filleau ................. 73/117.02 |
| 5,541,506 | A | 7/1996 | Kawakita et al. |
| 5,572,058 | A | 11/1996 | Biard |
| 5,612,618 | A | 3/1997 | Arakawa |
| 5,619,137 | A * | 4/1997 | Vig et al. ................. 324/251 |
| 5,621,319 | A | 4/1997 | Bilotti et al. |
| 5,657,189 | A | 8/1997 | Sandhu |
| 5,694,038 | A | 12/1997 | Moody et al. |
| 5,831,513 | A | 11/1998 | Lue |
| 5,844,411 | A | 12/1998 | Vogt |
| 5,942,895 | A | 8/1999 | Popovic et al. |
| 6,064,199 | A | 5/2000 | Walter et al. |
| 6,064,202 | A | 5/2000 | Steiner et al. |

(Continued)

FOREIGN PATENT DOCUMENTS

DE    10 2005 014 509 B4    10/2006
DE    10 2006 037 226        2/2008

(Continued)

OTHER PUBLICATIONS

Melexis MLX 90324; "'Under-the-Hood' Triaxis Rotary Position feat. SENT Protocol;" 3901090324 Data Sheet; Dec. 2008; 40 pages.

(Continued)

*Primary Examiner* — Patrick Assouad
*Assistant Examiner* — Alexander J Nemtzow
(74) *Attorney, Agent, or Firm* — Daly, Crowley, Mofford & Durkee, LLP

(57) ABSTRACT

A magnetic field sensor and a method used therein provide an output signal in angle units representative of an angle of rotation of a target of and also an output signal in speed units representative of a speed of rotation of the target object. A power control circuit can cycle a magnetic field sensor on and off in accordance with a sensed rotation speed of the object.

31 Claims, 5 Drawing Sheets

(56) References Cited

U.S. PATENT DOCUMENTS

| | | | |
|---|---|---|---|
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,687,644 B1 | 2/2004 | Zinke et al. | |
| 6,768,301 B1 | 7/2004 | Hohe et al. | |
| 6,872,467 B2 | 3/2005 | Qian et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,075,290 B2 | 7/2006 | Collier-Hallman et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 8,076,927 B2 | 12/2011 | Ausserlechner et al. | |
| 8,508,218 B2 | 8/2013 | Reymond et al. | |
| 2002/0111763 A1* | 8/2002 | Koga | 702/151 |
| 2003/0057941 A1* | 3/2003 | Collier-Hallman et al. | 324/163 |
| 2004/0115478 A1 | 6/2004 | Qian et al. | |
| 2006/0011999 A1 | 1/2006 | Schott et al. | |
| 2007/0029998 A1 | 2/2007 | Popovic et al. | |
| 2009/0121707 A1 | 5/2009 | Schott | |
| 2009/0174395 A1 | 7/2009 | Thomas et al. | |
| 2010/0156397 A1 | 6/2010 | Yabusaki et al. | |
| 2010/0164491 A1 | 7/2010 | Kejik et al. | |
| 2010/0231202 A1 | 9/2010 | Scheller et al. | |
| 2010/0264909 A1 | 10/2010 | Scheller et al. | |
| 2011/0025313 A1 | 2/2011 | Zangl et al. | |
| 2011/0187350 A1 | 8/2011 | Ausserlechner et al. | |
| 2011/0248708 A1 | 10/2011 | Thomas et al. | |
| 2012/0286773 A1 | 11/2012 | Reymond et al. | |
| 2013/0238278 A1 | 9/2013 | Shoemaker et al. | |

FOREIGN PATENT DOCUMENTS

| | | | |
|---|---|---|---|
| EP | 0 631 416 B1 | 12/1994 | |
| EP | 0 875 733 B1 | 11/1998 | |
| EP | 0 916 074 B1 | 5/1999 | |
| EP | 0 944 888 B1 | 10/2001 | |
| EP | 2 000 813 A1 | 12/2008 | |
| EP | 2 000 814 A2 | 12/2008 | |
| EP | 2000813 A1 * | 12/2008 | G01R 33/07 |
| JP | 58-055688 A | 4/1983 | |
| JP | 2003-042709 | 2/2003 | |
| JP | 2005-241269 | 9/2005 | |
| JP | 2010-014607 | 1/2010 | |
| JP | 2010-078366 | 4/2010 | |
| JP | 2010 145293 A | 7/2010 | |
| WO | WO 98/10302 | 3/1998 | |
| WO | WO 98/54547 | 12/1998 | |
| WO | WO 00/02266 | 1/2000 | |
| WO | WO 03/036732 A2 | 5/2003 | |
| WO | WO 2004/025742 A1 | 3/2004 | |
| WO | WO 2006/056289 A1 | 6/2006 | |
| WO | WO 2006/074989 A2 | 7/2006 | |
| WO | WO 2008 145662 A1 | 12/2008 | |
| WO | WO 2009/124969 A1 | 10/2009 | |

OTHER PUBLICATIONS

Donovan et al.; "Circuits and Methods for Automatically Adjusting a Magnetic Field Sensor in Accordance with a Speed of Rotation Sensed by the Magnetic Field Sensor;" U.S. Appl. No. 13/213,406, filed Aug. 19, 2011; 43 pages.

Invitation to Pay Additional Fees and, Where Applicable, Protest Fee; PCT/US2012/032061, Date of mailing Sep. 4, 2012, 12 pages.

Pavel, Kejik et al., "Ultra low-power angular position sensor for high-speed portable applications", Sensors, 2009, IEEE, IEEE, Piscataway, NJ, USA. Oct. 25, 2009, pp. 173-176, XP031618610, ISBN: 978-1-4244-4548-6, abstract; figures 1,2; section I and II.

Reymond S. et al., "True 2D CMOS Integrated Hall Sensor", Sensors, 2007 IEEE, IEEE, PI, Oct. 28, 2007, pp. 860-863, XP031221197, ISBN: 978-1-4244-1261-7, the whole document.

Banjevic M. et al., "2D CMOS Integrated Magnetometer Based on the Miniaturized Circular Vertical Hall Device", Solid State Sensors, Actuators, and Microsystems Conference, 2009, Transducers 2009. International, IEEE, Piscataway, NJ. Jun. 21, 2009, pp. 877-880, XP031545768, ISBN: 978-1-4244-4190-7, p. 877 and 878.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf, downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; "Allegro Microsystems, Inc.; AN296061 Data Sheet: Ring Magnet Speed Sensing for Electronic Power Steering;" published Jul. 21, 2009; pp. 1-4.

(56) References Cited

OTHER PUBLICATIONS

Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The 8th International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor+Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The 8th International Conference on Solid-State Sensors and Acutators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
SENSIMA technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettrici%20ll/Sensori%20e%20trasduttori/Data%20Sheet%20-%202SA-10.pdf; pp. 1-7.
van der Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.
PCT Search Report and Written Opinion of the ISA; dated Jan. 2, 2013; for PCT Pat. App. No. PCT/US2012/032061; 21 pages.
Drljaca, et al.; "Nonlinear Effects In Magnetic Angular Position Sensor With Integrated Flux Concentrator;" Proc. 23rd International Conference on Microelectronics (MIEL 2002); vol. 1; NIS; Yugoslavia; May 12-15, 2002; pp. 223-226.
Allegro Microsystems, Inc.; "High Precision Linear Hall Effect Sensor IC with a Push/Pull, Pulse Width Modulated Output;" A1351; pp. 1-23.
Allegro Microsystems, Inc., "High Precision 2-Wire Linear Hall Effect Sensor IC with a Pulse Width Modulated Output;" A1354; pp. 1-22.
Allegro Microsystems, Inc.; "High Precision Linear Hall-Effect Sensor with an Open Drain Pulse Width Modulated Output;" A1356; pp. 1-20.
Allegro Microsystems, Inc.; "Low-Noise Programmable Linear Hall Effect Sensor IC's with Adjustable Bandwidth (50 kHz Maximum) and Analog Output;" A1360, A1361 and A1362; pp. 1-25.
Baschirotto et al.; A.; "Development and Analysis of a PCB Vector 2-D Magnetic Field Sensor System for Electronic Compasses;" IEEE Sensors Journal, vol. 6, No. 2; Apr. 2006; pp. 365-371.
Kejik, P. et al.; "Purley CMOS Angular Position Sensor Based on a New Hall Microchip;" 34th Annual Conference of IEEE Industrial Electronics; IECON; Nov. 10-13, 2008; pp. 1777-1781.
Kejik, P.et al.; "Ultra Low-Power Angular Position Sensor for High-Speed Portable Applications;" 2009 IEEE Sensors Conference; Oct. 25-28, 2009; pp. 173-176.
Reymond, S. et al.; "True 2D CMOS Integrated Hall Sensor," 2007 IEEE Sensors Conference; Oct. 28-31, 2007; pp. 860-863.
Gerhauser, H., "Intelligente 3D-Magnetfeld Snesorik;" Fraunhofer-Institut for Integrierte Schaltungen IIS; www.iis.fraunhofer.de/asic/analog; Oct. 2009; 2 pages.
Melexis Microelectronic Integrated Systems; MLX90333; "Triaxis 3D-Joystick Position Sensor;" Data Sheet; Mar. 2009; 43 pages.
Memsic Corporation; AN-00MM-004; "Electronic Tilt Compensation;" Mar. 2008; 5 pages.
Memsic Corporation; AN-00MM-003; "Magnetic Sensor Calibration;" Mar. 2008; 5 pages.
Memsic Corporation; AN-00MM-002; "Magnetometer Soldering Methodology;" Jun. 2008; 2 pages.
Memsic Corporation; AN-00MM-001; "Magnetometer Fundamentals;" Jun. 2008; 6 pages.
Memsic Corporation; AN-00MM-005; "Magnetic Sensor Placement Guidelines;" Oct. 2008; 2 pages.
Memsic Corporation; MMC312xMQ; "Tri-axis Magnetic Sensor, with I²C Interface;" Aug. 14, 2008; 9 pages.
Memsic Corporation; MMC314xMQ; "Ultra Small 3-axis Magnetic Sensor, with I²C Interface;" Mar. 31, 2010; 8 pages.
Micronas GmbH; "HAL® 3625 Programmable Direct Angle Sensor;" Product Information; Sep. 2009; 2 pages.
Petrie; "Circular Vertical Hall Magnetic Field Sensing Element and Method with a Plurality of Continuous Output Signals;" U.S. Appl. No. 13/035,243, filed Feb. 25, 2011; 56 pages.
PCT Search Report and Written Opinion of the ISA, dated Dec. 19, 2012; for PCT Pat. App. No. PCT/2012/049903; 14 sheets.
PCT International Preliminary Report on Patentability and Written Opinion of the ISA; dated Oct. 24, 2013; for PCT Pat. App. No. PCT/US2012/032061; 16 pages.
Office Action dated Oct. 25, 2013; for U.S. Appl. No. 13/213,406; 29 pages.
Response filed Jan. 17, 2014; to Office Action dated Oct. 25, 2013; for U.S. Appl. No. 13/213,406; 14 pages.
PCT International Preliminary Report on Patentability and Written Opinion of the ISA dated Mar. 6, 2014; for PCT Pat. App. No. PCT/US2012/049903; 11 pages.
Notice of Allowance dated Mar. 20, 2014; for U.S. Appl. No. 13/213,406; 13 pages.

\* cited by examiner

US 8,729,890 B2

MAGNETIC ANGLE AND ROTATION SPEED SENSOR WITH CONTINUOUS AND DISCONTINUOUS MODES OF OPERATION BASED ON ROTATION SPEED OF A TARGET OBJECT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor that can provide an output signal representative of an angle of rotation and a speed of rotation of a target object.

BACKGROUND OF THE INVENTION

Magnetic field sensing elements can be used in a variety of applications. In one application, a magnetic field sensing element can be used to detect a direction of a magnetic field, i.e., and angle of the direction of the magnetic field. In another application, a magnetic field sensing element can be used to sense an electrical current. One type of current sensor uses a Hall effect magnetic field sensing element in proximity to a current-carrying conductor.

Planar Hall elements and vertical Flail elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element is but one element that can provide an output signal representative of an angle of a magnetic field, i.e., an angle sensor. For example, an angle sensor can be provided from a plurality of separate vertical Hall elements or a plurality of magnetoresistance elements.

It would be desirable to provide circuits that can process output signals from an angle sensor to provide an output signal representative of both an angle of a magnetic field (i.e., target object) and also a speed of rotation of the target object, preferably in common units, for example, revolutions per minute (RPM).

SUMMARY OF THE INVENTION

The present invention provides circuits that can process output signals from an angle sensor to provide an output signal representative of both an angle of a magnetic field (i.e., target object) and also a speed of rotation of the target object, preferably in common units, for example, revolutions per minute (RPM).

In accordance with one aspect of the present invention a magnetic field sensor for sensing a rotation of an object includes a semiconductor substrate having first and second parallel major surfaces. The magnetic field sensor also includes a plurality of magnetic field sensing elements disposed upon the semiconductor substrate. The plurality of magnetic field sensing elements is configured to generate a respective plurality of magnetic field sensing element output signals responsive to a magnetic field having a direction component in an x-y plane parallel to the first major surface of the semiconductor substrate. The x-y plane has an x-direction and a y-direction orthogonal to the x-direction. The magnetic field sensor also includes an x-y direction component circuit disposed upon the semiconductor substrate, coupled to receive a first intermediate signal representative of the plurality of magnetic field sensing element output signals, and configured to generate an x-y angle signal as a first output signal from the magnetic field sensor indicative of an angle of the direction component of the magnetic field in the x-y plane. The magnetic field sensor also includes a rotation speed sensing circuit disposed upon the semiconductor substrate, coupled to receive a signal representative of the x-y angle signal, and configured to generate a rotation speed signal as a second output signal from the magnetic field sensor indicative of a rotation speed of the object.

In accordance with another aspect of the present invention, a method used in a magnetic field sensor includes generating, in the magnetic field sensor, a plurality magnetic field sensing element output signals with a corresponding plurality of magnetic field sensing elements disposed upon a semiconductor substrate. The plurality of magnetic field sensing element output signals is responsive to a magnetic field having a direction component in an x-y plane parallel to the first major surface of the semiconductor substrate. The x-y plane has an x-direction and a y-direction orthogonal to the x-direction. The method also includes generating, in the magnetic field sensor, an x-y angle signal as a first output signal from the magnetic field sensor indicative of an angle of the direction component in the x-y plane in response to a first intermediate signal representative of the plurality of magnetic field sensing element output signals. The method also includes generating, in the magnetic field sensor, a rotation speed signal as a second output signal from the magnetic field sensor indicative of a rotation speed of the object in response to a signal representative of the x-y angle signal.

In accordance with another aspect of the present invention, a magnetic field sensor for sensing a rotation of an object includes a power control circuit disposed on the semiconductor substrate. The power control circuit includes a timer configured to generate a timing signal having first and second states, wherein a portion of the magnetic field sensor powers up in response to the first state of the timing signal and powers down in response to the second state of the timing signal.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

Vertical Hall elements can be arranged in a so-called circular vertical Hall (CVH) sensing element over a common circular implant region in s substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While a circular vertical Hall (CVH) magnetic field sensing element, which has a plurality of vertical Hall elements, is described in examples below, it should be appreciated that the same or similar techniques and circuits apply to any type of magnetic field sensing element arranged in a manner to detect an angle of a pointing direction of a magnetic field, i.e., a rotation angle of a target object to which a magnet is attached.

Figure 1:
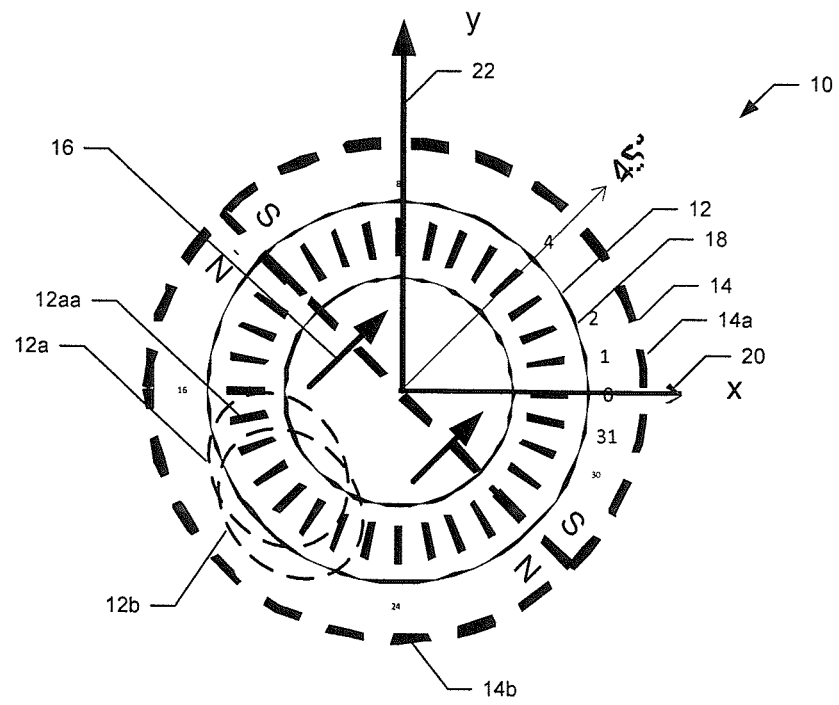
FIG. 1 is a pictorial showing a circular vertical Hall (CVH) sensing element having a plurality of vertical Hall elements arranged in a circle over a common implant region and a two pole magnet disposed proximate to the CVH sensing element.

Referring to FIG. 1, a circular vertical Hall (CVH) sensing element 12 includes a circular implant region 18 in a substrate (not shown). The CVH sensing element 12 has a plurality of vertical Hall elements, of which a vertical Hall element 12a is but one example. The plurality of vertical Hall element contacts is disposed over the common circular implant region 18. Each vertical Hall element has a plurality of Hall element contacts (e.g., four or five contacts). Each vertical Hall element contact can be comprised of a metal contact over a contact diffusion region in the substrate, diffused into the circular implant region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14a and a south side 14b can be disposed over the CVH 12. The circular magnet 14 tends to generate a magnetic field 16 having a direction from the north side 14a to the south side 14b, here shown to be pointed to a direction of about forty-five degrees relative to x-axis 20.

In some applications, the circular magnet 14 is mechanically coupled to a rotating target object, for example, an automobile steering shaft of an automobile camshaft, and is subject to rotation relative to the CVH sensing element 12. With this arrangement, the CVH sensing element 12 in combination with an electronic circuit described below can generate a signal related to the angle of rotation of the magnet 14, i.e., and angle of rotation of the target object to which the magnet is coupled.

Figure 1A:
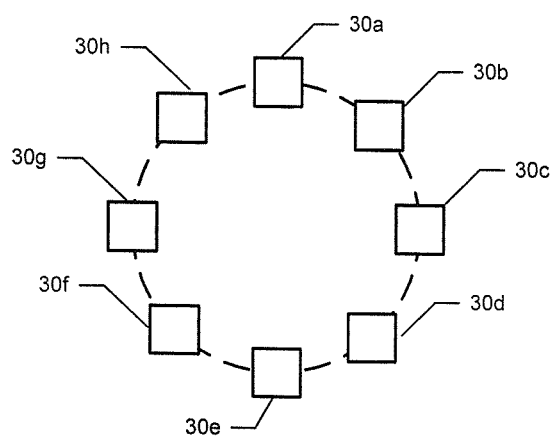
FIG. 1A is a pictorial showing a plurality of other magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements. These elements can be coupled to an electronic circuit the same as or similar to electronic circuits described below in conjunction with FIG. 3. There can also be a magnet the same as or similar to the magnet 14 of FIG. 1 disposed proximate to the magnetic field sensing elements 30a-30h.

Figure 2:
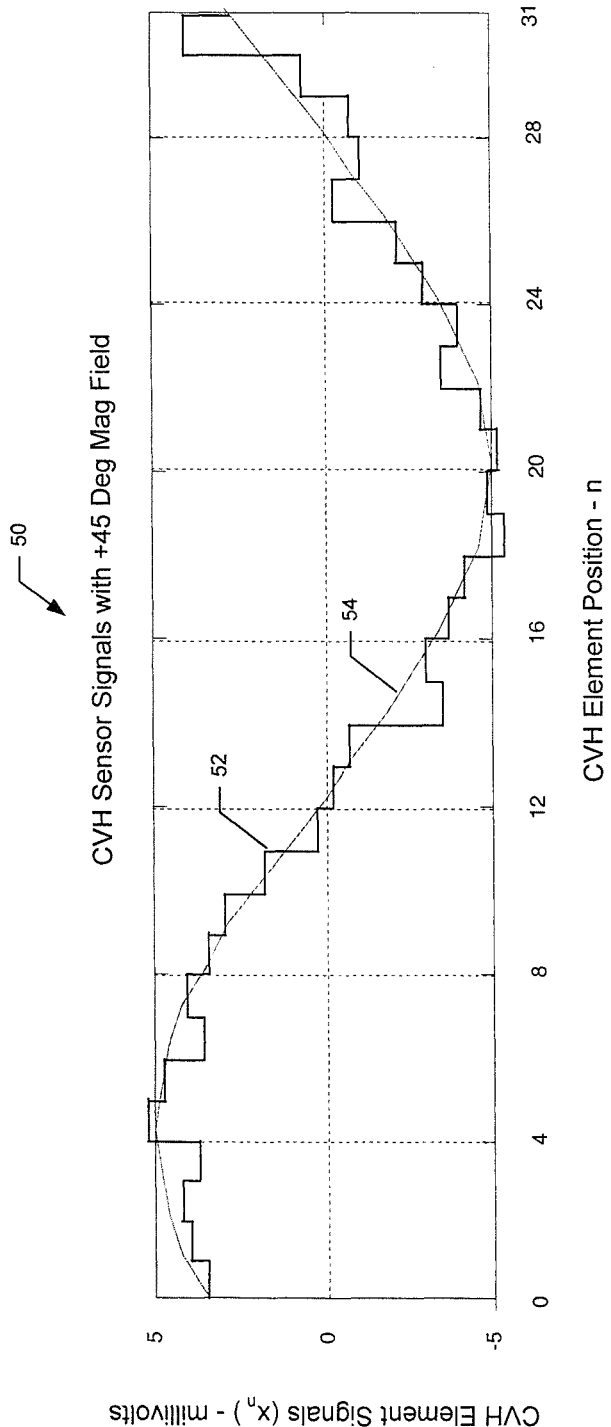
FIG. 2 is a graph showing an output signal as may be generated by the CVH sensing element of FIG. 1 or by the sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008/056517, groups of contacts of each vertical Hall element can be used in a multiplexed or chopped arrangement to generate chopped output signals from each vertical Hall element. Thereafter, a new group of adjacent vertical Hall element contacts can be selected (i.e., a new vertical Hall element), which can be offset by one element from the prior group. The new group can be used in the multiplexed or chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, i.e., from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008/056517, a phase of the signal 52 (e.g., a phase of the signal 54) can be found and can be used to identify the pointing direction of the magnetic field 16 of FIG. 1 relative to the CVH 12.

Figure 3:
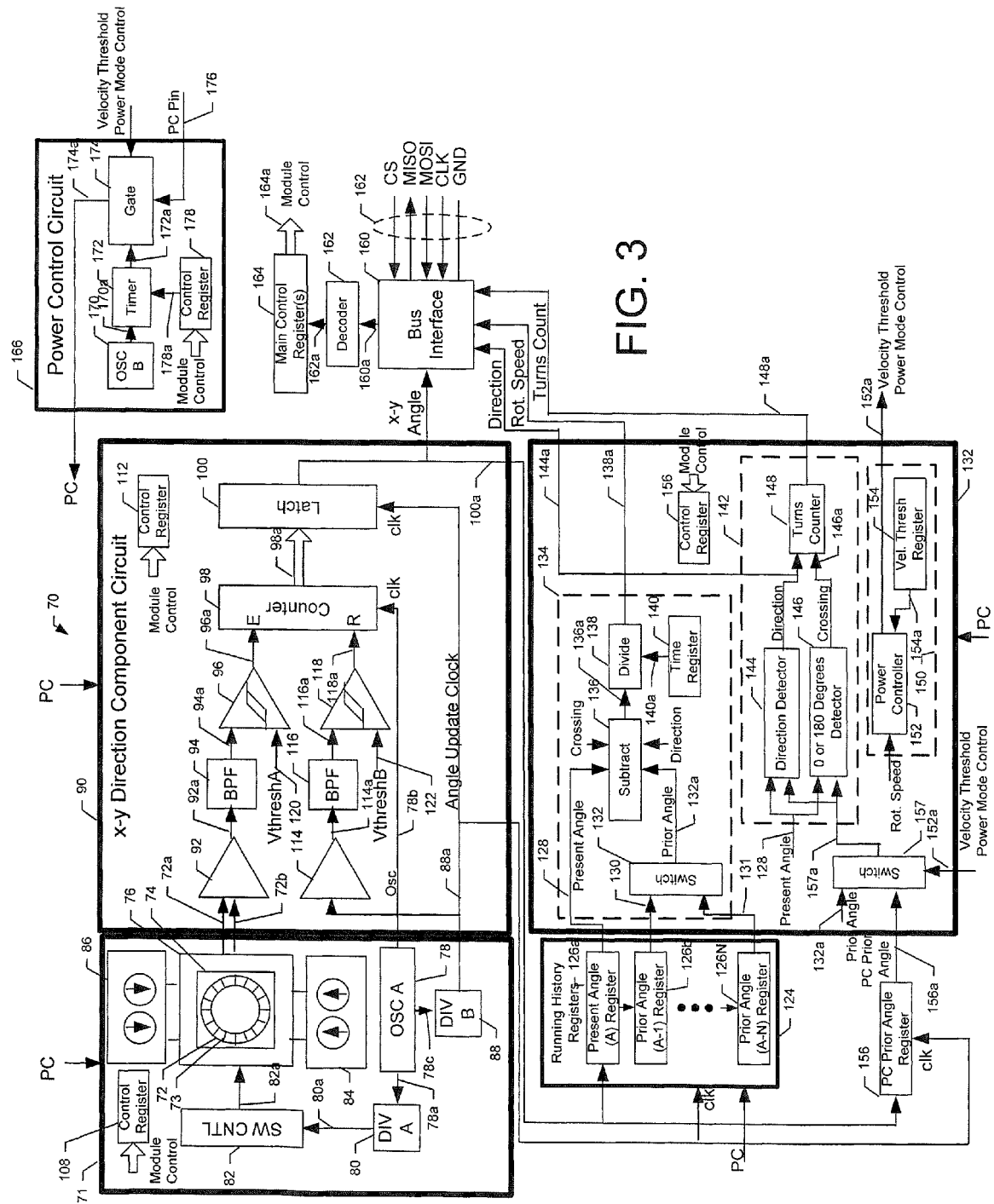
FIG. 3 is a block diagram showing a magnetic field sensor having an angle sensing circuit operable to provide a signal representative of an angle of rotation of a target object, a speed sensing circuit operable to provide a signal representative of a speed of rotation of the target object, and optionally a direction sensing circuit operable to provide an output signal representative of a direction of rotation of the target object and a turns counting circuit operable to provide a signal representative of a turns count of rotation's of the target object, and further having a power control circuit to cycle power on an off to portions of the magnetic field sensor.

Referring now to FIG. 3, a magnetic field sensor 70 includes a sensing circuit 71 having a CVH sensing element 72 having a plurality of vertical Hall elements, each vertical Hall element comprising a group of vertical Hall element contacts (e.g., five vertical Hall element contacts), of which a vertical Hall element contact 73 is but one example. In some embodiments, the CVH sensing element 72 is replaced by a group of magnetic field sensing elements described in conjunction with FIG. 1A.

A magnet (not shown) can be disposed proximate to the CVH sensing element 72, and can be coupled to a target object (not shown). The magnet can be the same as or similar to the magnet 14 of FIG. 1

In some embodiments, a switching circuit 74 can provide a CVH differential output signal 72a, 72b from the CVH sensing element 72.

The CVH differential output signal 72a, 72b is comprised of sequential output signals taken one-at-a-time around the CVH sensing element 72, wherein each output signal is generated on a separate signal path and switched by the switching circuit 74 into the path of the differential signal 72a, 72b. Therefore, the CVH differential output signal 72a, 72b can be represented as a switched set of CVH output signals $x_n=x_0$ to $x_{N-1}$, taken one at a time, where n is equal to a vertical Hall element position (i.e., a position of a group of vertical Hall element contacts that form a vertical Hall element) in the CVH sensing element 72, and where there are N such positions.

In one particular embodiment, the number of vertical Hall elements (each comprising a group of vertical Hall element contacts) in the CVH sensing element 72 is equal to the total number of sensing element positions, N. In other words, the CVH differential output signal 72a, 72b can be comprised of sequential output signals, wherein the CVH differential output signal 72a, 72b is associated with respective ones of the vertical Hall elements in the CVH sensing element 72 as the switching circuit 74 steps around the vertical Hall elements of the CVH sensing element 72 by increments of one, and N equals the number of vertical Hall elements in the CVH sensing element 72. However, in other embodiments, the increments can be by greater than one vertical Hall element, in which case N is less than the number of vertical Hall elements in the CVH sensing element 72.

In one particular embodiment, the CVH sensing element 72 has thirty-two vertical Hall elements, i.e., N=32, and each step is a step of one vertical Hall element contact position (i.e., one vertical Hall element position). However, in other embodiments, there can be more than thirty-two or fewer than thirty-two vertical Hall elements in the CVH sensing element 72, for example sixty-four vertical Hall elements. Also, the increments of vertical Hall element positions, n, can be greater than one vertical Hall element contact.

In some embodiments, another switching circuit 76 can provide the above-described "chopping" of groups of the vertical Hall elements within the CVH sensing element 72. Chopping will be understood to be an arrangement in which a group of vertical Hall element contacts, for example, five vertical Hall element contacts that form one vertical Hall element, are driven with current sources 84, 86 in a plurality of connection configurations, and signals are received from the group of vertical Hall element contacts in corresponding configurations to generate the CVH differential output signal 72a, 72b. Thus, in accordance with each vertical Hall element position, n, there can be a plurality of sequential output signals during the chopping, and then the group increments to a new group, for example, by an increment of one vertical Hall element contact.

The magnetic field sensor 70 includes an oscillator 78 that provides clock signals 78a, 78b, 78c, which can have the same or different frequencies. A divider 80 is coupled to receive the clock signal 78a and configured to generate a divided clock signal 80a. A switch control circuit 82 is coupled to receive the divided clock signal 80a and configured to generate switch control signals 82a, which are received by the switching circuits 74, 76 to control the sequencing around the CVH sensing element 72, and, optionally, to control the chopping of groups of vertical Hall elements within the CVH sensing element 72 in ways described above.

The magnetic field sensor 70 can include a divider 88 coupled to receive the clock signal 78c and configured to generate a divided clock signal 88a, also referred to herein as an "angle update clock" signal.

One or more power control registers 108 can control one or more parameters of the sensing circuit 71 in ways described more fully below.

The magnetic field sensor 70 also includes an x-y direction component circuit 90. The x-y direction component circuit 90 can include an amplifier 92 coupled to receive the CVH differential output signal 72a, 72b. The amplifier 92 is configured to generate an amplified signal 92a. A bandpass filter 94 is coupled to receive the amplified signal 92a and configured to generate a filtered signal 94a. A comparator 96, with or without hysteresis, is configured to receive the filtered signal 94a. The comparator 96 is also coupled to receive a threshold signal 120. The comparator 96 is configured to generate a thresholded signal 96a generated by comparison of the filtered signal 94a with the threshold signal 120.

The x-y direction component circuit 90 also includes an amplifier 114 coupled to receive the divided clock signal 88a. The amplifier 114 is configured to generate an amplified signal 114a. A bandpass filter 116 is coupled to receive the amplified signal 114a and configured to generate a filtered signal 116a. A comparator 118, with or without hysteresis, is coupled to receive the filtered signal 116a. The comparator 118 is also coupled to receive a threshold signal 122. The comparator 118 is configured to generate a thresholded signal 118a by comparison of the filtered signal 116a with the threshold signal 122.

It should be understood that the amplifier 114, the bandpass filter 116, and a comparator 118 provide a delay of the divided clock signal 88a in order to match a delay of the circuit channel comprised of the amplifier 92, the bandpass filter 94, and the comparator 96. The matched delays provide phase matching, in particular, during temperature excursions of the magnetic field sensor 70.

A counter 98 can be coupled to receive the thresholded signal 96a at an enable input, to receive the clock signal 78b at a clock input, and to receive the thresholded signal 118a at a reset input.

The counter 98 is configured to generate a phase signal 98a having a count representative of a phase difference between the thresholded signal 96a and the thresholded signal 118a. The phase signal 98a is received by a latch 100 that is latched in accordance with the divided clock signal 88a. The latch 100 is configured to generate a latched signal 100a, also referred to herein as an "x-y direction signal."

It will be apparent that the latched signal 100a is a multi-bit digital signal that has a value representative of an angle of the magnetic field experience by the CVH sensing element 72, and thus, and angle of the magnet and target object.

In some embodiments, the clock signals 78a 78b 78c each have a frequency of about 20 MHz, the divided clock signal 80a has a frequency of about 1.25 MHz, and the angle update clock signal 88a has a frequency of about 4.8 kHz. However in other embodiments, the frequencies can be higher or lower than these frequencies. In some embodiments, the dividers 80, 88 are programmable by a user is ways described more fully below.

The x-y direction component circuit 90 can also include one or more control registers 112 used to set one or more parameter of the x-y direction component circuit 90 in ways described more fully below.

The magnetic field sensor 70 can also include running history registers 124. The running history registers 124 can include a set of registers 126a-126N arranged as a multibit shift register. The x-y angle signal 100a can be received by a present angle register 126a and stored as a present angle value. The running history registers 124 can be clocked by the divided clock signal 88a (the angle update clock signal). Thus, with each clock of the divided clock signal 88a, the present angle value stored in the present angle register 126a is shifted downward through the running history registers 124, becoming a prior angle value, and a new present angle value of the x-y angle signal 100a is stored in the present angle register 126a.

The x-y angle signal 100a is also received by a power control (PC) prior angle register 156 and stored as a power control prior angle value 156a in accordance with the angle update clock 100a. The prior angle history register 156 can be a non-volatile memory element, for example, an EEPROM. The running history registers 124 can be volatile or nonvolatile memory.

The magnetic field sensor 70 can also include a circuit 132. As described more fully below, the circuit 132 is configured to generate one or more of a direction signal 144a indicative of a direction of rotation of the target object sensed by the CVH sensing element 72, a rotation speed signal 138a indicative of a speed of rotation of the target object, or a turns count signal 148a indicative of a number of rotations of the target object.

To this end, the circuit 132 can include a speed sensing circuit 134. The speed sensing circuit 134 can include a switching circuit 132 coupled to receive one or more of prior angle values from the running history registers 124. The switching circuit 132 can provide a selected prior angle value 132a representative of a rotation angle of the target object at a prior time. The speed sensing circuit 134 can also include subtraction circuit 136. The subtraction circuit 136 is coupled to receive a present angle value 128 from the present angle register 126a. The subtraction circuit 136 is also coupled to receive the selected prior angle value 132a. For reasons described more fully below, the subtraction circuit 136 is also coupled to receive the direction signal 144a and a crossing signal 146a.

The subtraction circuit 136 is operable to subtract the prior angle value 132a from the present angle value 128, the difference being an angle of rotation of the target object between times at which the present angle value 128 and the selected prior angle value 132a were stored. Thus, the subtraction circuit 136 can generate a subtracted signal 136a representative of the angle of rotation of the target object between times at which the present angle value 128 and the selected prior angle value 132a were stored.

The speed sensing circuit 134 can also include a divide circuit 138 coupled to receive the subtracted signal 136a from subtraction circuit 136. A time register 140 can hold a time value and can communicate the time value 140a to the divide circuit 138. The divide circuit 138 can divide the subtracted signal 136a by the time value 140a, resulting in the rotation speed signal 138a.

It will be understood that, by proper selection of the time value 140a in conjunction with which one of the running history registers 124 is used to generate the selected prior angle value 132a, the rotation speed signal 138a can have any desired rotation speed units, for example, revolutions per minute (rpm). Operation of the speed sensing circuit 134 is further described below in conjunction with FIGS. 4 and 5.

The magnetic field sensor 70 can, in some embodiments, operate in two modes of operation, a continuous mode and a discontinuous mode. When in the continuous mode of operation, a switch 157 selects, as a signal 157a, the prior angle value 132a. When in the discontinuous mode of operation, the switch 157 selects, as the signal 157a, the PC prior angle value 156a stored in the PC prior angle register 156.

The circuit 132 can also include a turns count sensing circuit 142. The turns count sensing circuit 142 can include a direction detector 144 coupled to receive the present angle value 128 and coupled to receive the signal 157a as a selected one of the power control (PC) prior angle value 156a or the prior angle value 132a. As described above, the selection made by the switch 157 is made according to a mode of operation. The direction detector 144 is configured to generate the direction signal 144a representative of a direction of rotation of the target object sensed by the CVH sensing element 72.

It will be understood that the power control prior angle value 156a can be value indicative of an angle of rotation of the target object at a time of a last power down of the circuit. Thus, in the discontinuous mode of operation, the direction signal 144a is representative of a direction of rotation of the target object since the last power down of the magnetic field sensor 70.

It will be understood that the prior angle value 132a can be a value indicative of an angle of rotation of the target object at some previous time during continuous operation. Thus, in the continuous mode of operation, the direction signal 144a is representative of a direction of rotation of the target object between the times that the present angle value 128 and the prior angle value 132a were taken.

The turns counting circuit 142 can also include a zero or one hundred eighty degrees detector 146 coupled to receive the present angle value 128 and 128 and coupled to receive the signal 157a as a selected one of the power control (PC) prior angle value 156a or the prior angle value 132a. As described above, the selection made by the switch 157 is made according to a mode of operation.

When in the discontinuous mode of operation, the zero or 180 degrees detector 146 can generate a crossing signal 146a representative of occurrences of crossings of the rotations of the target object through zero degrees and/or through one hundred eighty degrees that occurred since the last time the magnetic field sensor 70 was powered off.

When in the continuous mode of operation, the zero or 180 degrees detector 146 can generate a crossing signal 146a representative of occurrences of crossings of the rotations of the target object through zero degrees and/or through one hundred eighty degrees that occurred between the times that the present angle value 128 and the prior angle value 132a were taken.

The turns counting circuit 142 can also include a turns counter 148 coupled to receive the direction signal 144a and the crossing signal 146a and configured to generate the turns count signal representative of a number of rotations experienced by the target object. Operation of the turns counting circuit 142 is further described below in conjunction with FIG. 4.

The circuit 132 can also include a velocity testing circuit 150. The velocity testing circuit 150 can include a power controller 152 coupled to receive the rotation speed signal 138a. The velocity test circuit 150 can also include a velocity threshold register 154 configured to store a velocity threshold value 154a. The power controller 152 is also coupled to receive the velocity threshold value 154a and configured to generate a velocity threshold mode control signal 152a. The velocity threshold mode control signal 152a is representative of the rotation speed of the target object being above or below the velocity threshold value 154a.

From discussion below in conjunction with FIG. 4, it will become apparent that a state of the velocity threshold power mode control signal 152a is indicative of in which one of the two modes of operation the magnetic field sensor 70 is operating. Let it suffice here to say that if the rotation speed of the target object is slow, power to portion of the magnetic field sensor 70 can cycled on and off to conserve power, which is the above-descried discontinuous mode of operation. If the rotation speed of the target object is fast, then the magnetic field sensor 70 can be powered on continuously, which is the above-descried continuous mode of operation One or more power control registers 156 can control one or more parameters of the circuit 132 in ways described more fully below.

The magnetic field sensor 70 can also include a bus interface circuit 160. The bus interface circuit 160 can be coupled to receive the x-y angle signal 100a and the rotation speed signal 138a. Optionally, the bus interface circuit 160 can be coupled to receive the direction signal 144a and/or the turns count signal 148a. The bus interface circuit 160 is coupled with a bus interface structure 162 to communicate with another processor (not shown) with a standard format, for example, a SENT format, a serial peripheral interface format (SPI), or an I2C format. The bus interface structure can communicate the x-y angle signal 100a and the rotation speed signal 138a to the other processor. Optionally, the bus interface circuit 160 can communicate the direction signal 144a and/or the turns count signal 148a to the other processor.

As used herein, the term "bus" is used to describe either a parallel bus or a serial bus.

The bus interface circuit 160 can receive various control data upon the bus interface structure 162. The bus interface circuit 160 can communicate the control data 160a to a decoder circuit 162, which can communicate decoded information 162a to main control registers 164, which can store the decoded control data. The main control registers 164 can communicate a module control signal 164a to control registers within the various modules described above and below, to affect behaviors of the modules.

The magnetic field sensor 70 can also include a power control circuit 166 coupled to receive the velocity threshold mode control signal 152a. The power control circuit 166 can also be coupled to receive a signal 176 from a power control pin of the magnetic field sensor 70, i.e., an external integrated circuit pin.

The power control circuit 166 can include an oscillator 170 configured to generate a clock signal 170a. The power control circuit 166 can also include a timer circuit 172 coupled to receive the clock signal 170a and configured to generate a timing signal 172a (i.e., a signal having pulses) synchronous with the clock signal 170a.

The timing signal 172a can include a string of pulses that occur at a rate determined by a frequency of the clock signal 170a. In some embodiments, the pulses of the timing signal 172a occur at a rate of about 10 ms and have pulse durations of about 500 µs.

A gate 174, for example an OR gate, can be coupled to receive the timing signal 172a, coupled to receive the power control pin signal 176, and coupled to receive the velocity threshold mode control signal 152a. In response to the input signals, the gate 174 can generate a power control signal 174a responsive to any one of the input signals.

In operation, the velocity threshold mode control signal 174a operates as a gating signal to allow any either of the signals 172a, 176 to turn on and off modules 71, 90, and 132 when the velocity threshold mode control signal 152a is in a first one of two states (i.e., the discontinuous mode of operation). If in the other state, the velocity threshold mode control signal 152a does not allow the power control circuit 166 to turn on and off the modules 71, 90, and 132 (i.e., the continuous mode of operation results).

When placed into the discontinuous mode of operation by the velocity threshold mode control signal 152a, a substantial part of the magnetic field sensor 70 can cycle on and off, for example, in accordance with the timing signal 172a, in order to conserve power. Each time the magnetic field sensor 70 turns off, an angle of the target object at that time is stored in the power control prior angle register 156. Each time the magnetic field sensor 70 turns on, the power control prior angle value 156a is processed by the turns count sensing circuit 142 to identify if the target object has rotated, in which direction it has rotated, and whether the rotation has cross through zero or 180 degrees since the time that the magnetic field sensor 70 turned off.

Also, each time the magnetic field sensor 70 turns on, the velocity testing circuit 150 can test the rotation speed of the object to identify if the velocity threshold mode control signal 152a should be in or remain in a state to allow the magnetic field sensor 70 to turn on and off (discontinuous mode of operation) or whether the velocity threshold mode control signal 152a should be in a state to not allow the magnetic field sensor 70 to turn on and off (continuous mode of operation).

The one or more control registers 108 in the sensing circuit 71 can receive and store a variety of parameters from the main control registers 164, including, but not limited to, a frequency value corresponding to a frequency at which the oscillator 78 will operate, a step value communicated to the switching circuit 74 corresponding to step sizes between adjacent vertical Hall elements within the CVH sensing element 72, current output values corresponding to the current sources 86, 84, divide ratios of the dividers 80, 88, and a chopping enable value corresponding to whether the switching circuit 76 generates chopping or does not generate chopping.

The one or more control registers 112 of the x-y direction component circuit 90 can also receive and store a variety of parameters from the bus interface circuit 160, including, but not limited to, filter characteristics of the bandpass filters 94, 116, (e.g., center frequency and bandwidth) and the threshold values 120, 122.

The one or more control registers 156 of the circuit 132 can also receive and store a variety of parameters from the main control registers 164, including, but not limited to, the velocity threshold value 154a, the time value 140a, and a switch setting for the switch circuit 132 corresponding to which one of the prior angle registers are used to generate the prior angle value 132a.

One or more control registers 178 within the power control circuit 166 can also store a variety of parameters from the main control registers 164, including, but not limited to, a frequency of the oscillator 170, a control signal value 178a to control a pulse width of the timing signal 172a and/or to enable or disable the timer circuit 172, enabling or disabling automatic power cycling resulting from the timing signal 172a.

Figure 4:
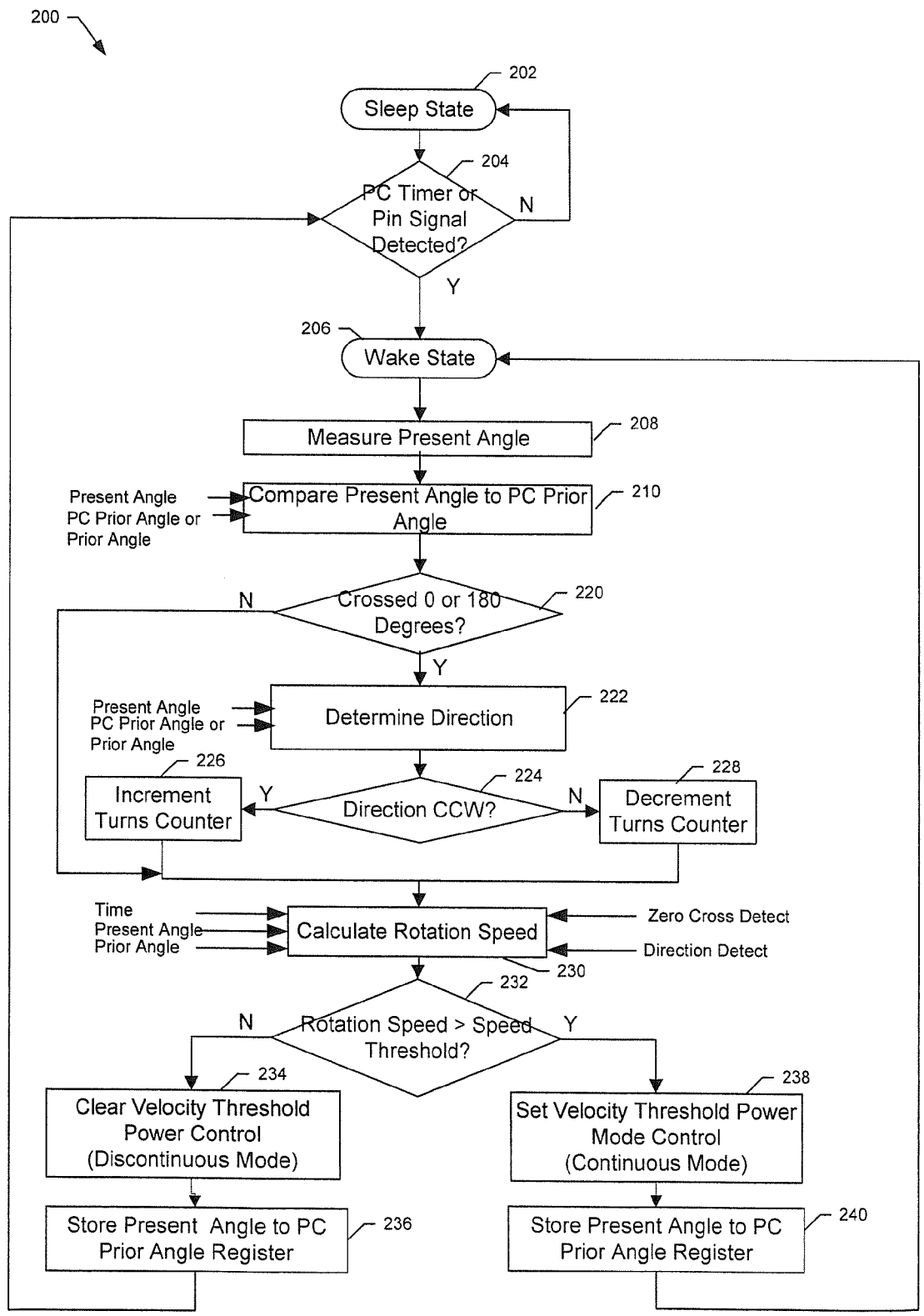
FIG. 4 is a flowchart showing a process that can be used by the magnetic field sensor of FIG. 3, including a step for calculating the rotation speed of the target object.
Figure 5:
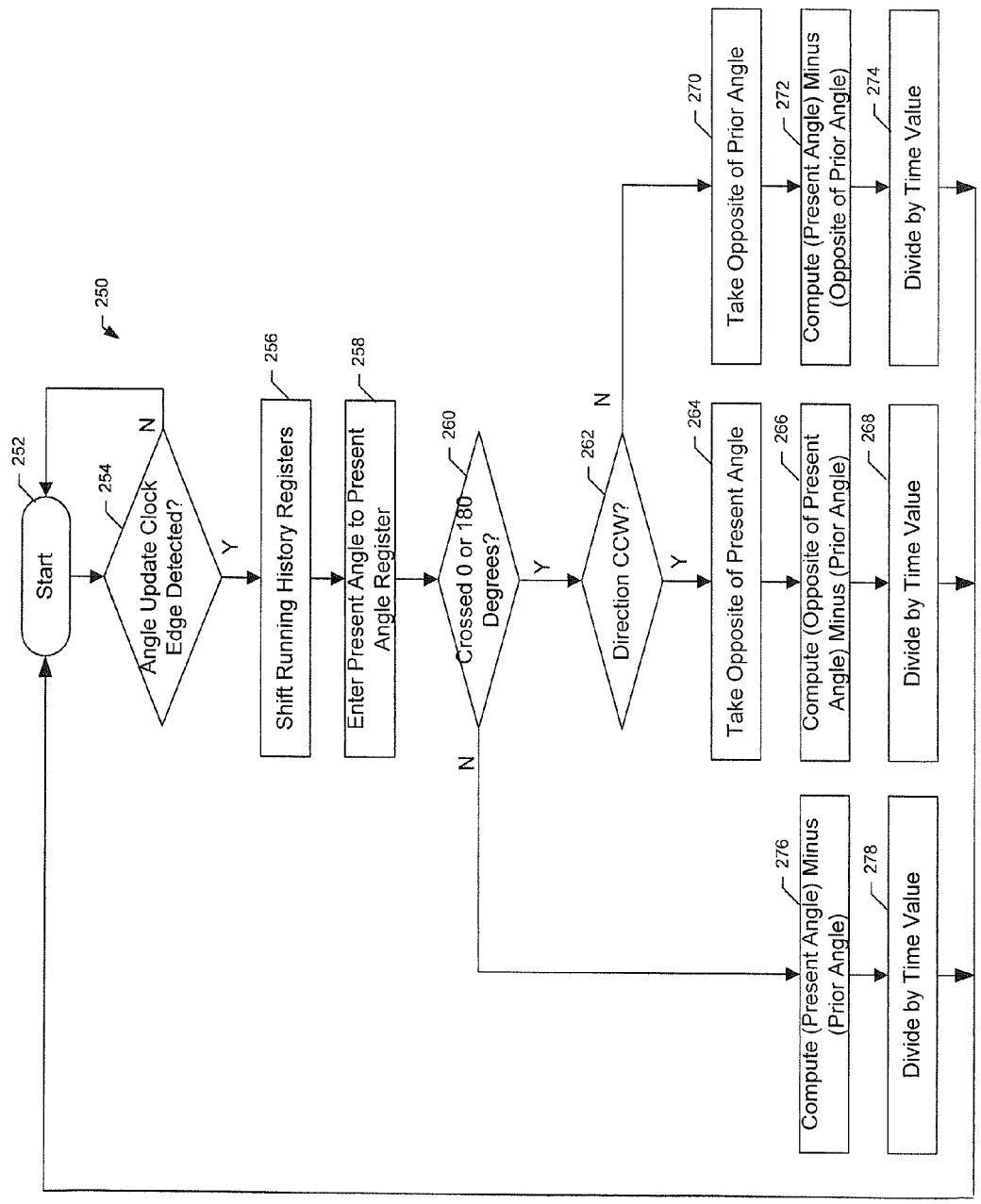
FIG. 5 is a flowchart showing a process that can be used to calculate the rotation speed of the target object.

It should be appreciated that FIGS. 4 and 5 show flowcharts corresponding to the below contemplated technique which would be implemented in the magnetic field sensor 70 (FIG. 3). Rectangular elements (typified by element 208 in FIG. 4), herein denoted "processing blocks," represent computer software instructions or groups of instructions. Diamond shaped elements (typified by element 204 in FIG. 3), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 4 a process 200 can describe operation of the magnetic field sensor 70 of FIG. 3 in the continuous and discontinuous mode of operation.

The process can begin in the above-described discontinuous mode of operation, in which case, first the mode is set to the discontinuous mode (e.g., the velocity threshold power mode control signal 152a of FIG. 3 is cleared) and the process 200 is entered at the sleep state 202. Alternatively, the process 200 can begin in the above-described continuous mode of operation, in which case, first the mode is set to the continuous mode (e.g., the velocity threshold power mode control signal 152a of FIG. 3 is set) and the process 200 is entered at the wake state 206.

For the sake of discussion, consider that the process begins at step 202 where a sleep state of the magnetic field sensor 70 of FIG. 3 is entered with the mode set to the discontinuous mode.

At block 204, it is determined if either a power on signal at the power control pin signal 176 or a pulse in the timing signal 172a is detected and indicative of a power on condition. If either signal is indicative of power on condition, then the process continues to block 206 were the wake state, i.e. a power on condition, is entered, and all modules of the magnetic field sensor 70 of FIG. 3 are power on by way of the power control (PC) signal 174a. Once the wake state is achieved, the process continues to block 208 where the present angle is measured, for example, by the x-y direction component circuit 90 of FIG. 3 to generate the x-y angle signal 100a.

Not shown as steps, but if this is the first time through the process 200, prior to next block 210, running history registers 124 of FIG. 3 can first be loaded with a present angle measurement and the running history registers 124 can be clocked one more time to establish a present angle value in the present angle register 126a different than values in the other registers 126b-126N if the target object is rotating. The PC prior angle register 156 can also first be loaded with the different value in the other registers.

Assuming instead that this process has been running for a while, the running history registers 126a-126N will hold different values if the target object is rotating and the PC prior angle register will hold a value of an angle of the target object stored the last time that the magnetic field sensor 70 powered down (i.e., to the sleep state 202).

At block 210, the measured present angle of the x-y angle value 100a is compared to another angle value selected from either the PC prior angle value 156a or the prior angle value 132a of FIG. 3, for example, by the turns count sensing circuit 142 of FIG. 3. The selection is made by the switch 157 of FIG. 3 in accordance with the mode of operation in which the process 200 is entered. For example, if entered in the discontinuous mode, the switch 152a selects the PC prior angle value 156a for the comparison.

Thus, at block 220, it is determined, for example, by the zero or 180 degree detector 146 of FIG. 3, whether rotation of the target object has crossed past zero or 180 degrees since the last time that the magnetic field sensor 70 of FIG. 3 powered off.

If the crossing of zero or 180 degrees occurred, the process continues to block 222, where the direction of rotation of the object since the last time it was powered off is determined 222, for example, by the direction detector 144 of FIG. 3. Since the mode is the discontinuous mode, again the PC prior angle is used for comparison with the present angle value.

At block 224, it is determined if the direction of rotation was counterclockwise since the last time the magnetic field sensor 70 was powered off. If the direction was counterclockwise, the process proceeds to block 226 where a turns counter, for example, the turns counter 148a of FIG. 3, is incremented. On the other hand, if at block 224 the direction was not counterclockwise, then the process proceeds instead to block 228, where the turns counter is decremented. It will be recognized that the turns counter 148 of FIG. 3 also receives the crossing signal 146a identified at block 220. The process then proceeds to block 230.

At block 230, rotation speed of the target object is calculated, for example, by the circuit 134 of FIG. 3. To this end the circuit 134 of FIG. 3, and the block 230, take as inputs the time value 140a of FIG. 3, the present angle value 128 of FIG. 3, the prior angle value 132a of FIG. 3, the crossing signal 146a of FIG. 3, in the direction signal 144a of FIG. 3. The process of block 230 is described more fully below in conjunction with FIG. 5. Let it suffice here to say that at block 230, the rotation speed signal 138a of FIG. 3 is calculated. The process then proceeds to block 232.

At block 232, if the detected rotation speed of the target object is greater than the speed threshold, for example, the velocity threshold value 154a of FIG. 3, then the process proceeds to block 238.

At block 238, since the target object has been identified to be rotating rapidly at block 232, the velocity threshold mode control signal 152a of FIG. 3 is set to condition that will maintain the power on state or wake state by way of the power control circuit 166 of FIG. 3. To this end, the velocity threshold power mode control signal 152a of FIG. 3 is set.

At block 240, the present angle value of the x-y angle signal 100a is stored to the power control prior angle register 156 of FIG. 3. Then, the process 200 returns to the wake state at block 206.

At block 232, if the rotation speed of the target object is not greater than the speed threshold, i.e., the target object is rotating slowly, the process continues instead to block 234.

At block 234, since the target object has been identified to be rotating slowly at block 232, the velocity threshold mode control signal 152a of FIG. 3 is cleared to condition that will cycle the power between sleep and wake states by way of the power control circuit 166 of FIG. 3. To this end, the velocity threshold power mode control signal 152a of FIG. 3 is cleared.

At block 236, the present angle value of the x-y angle signal 100a is stored to the power control prior angle register 156 of FIG. 3 and the process 200 returns to block 204.

At block 204, if either the power control pin signal 176 or the power control timer signal 17a is not indicative of the wake state, the process returns to block 202, thereby looping in the sleep state.

At block 220, if, the rotation of the target object has not crossed zero or 180 degrees, then the process 200 proceeds directly to block 230 as there is no need to determine direction at block 222 or to increment or decrement the turns counter at boxes 226, 228, respectively.

It should be understood that if the wake state of block 206 is arrived at by block 240, i.e., in the continuous mode of operation, then at blocks 210 and 222, the prior angle value 132a of FIG. 3 (rather than the PC prior angle value 156a) is used for comparison with the present angle value Referring now to FIG. 5, a process 250 to determine the rotation speed of the target object corresponds to block 230 of FIG. 4. The process 250 begins at block 254, where, the angle update clock 88a of FIG. 3 is inspected.

At block 254 if an edge, for example, a rising edge, of the angle update clock 88a is detected, then the process continues to block 256.

At block 256, contents of the running history registers 124 of FIG. 3 are shifted down, for example, by one register, and, at block 258, the present x-y angle signal 88a is entered into the present angle register 126a of FIG. 3.

At block 260, it is determined, for example, by the 0 or 180 degree detector, 146 if the target object has rotated through zero or 180 degrees.

If the target object has rotated through 0 or 180 degrees, then the process continues to block 262.

At block 262, if the target object has rotated counterclockwise, as detected, for example, by the direction detector 144, then the process continues to block 264.

At block 264, an opposite of the present angle value 128 of FIG. 3 is computed, for example, by the subtraction processor 136 of FIG. 3.

At block 266, it is computed, for example, by the subtraction processor 136, a difference between the opposite of the present angle value 128 and the prior angle value 132a of FIG. 3.

At block 268, the above difference is divided by the time value 140a of FIG. 3, for example, by the divide circuit 138 of FIG. 3, resulting in the rotation speed signal 144a.

At block 260, if the rotation of the target object has not passed through 0 or 180 degrees, then the process proceeds instead to block 276, where a difference between the present angle value 128 and the prior angle value 132a is computed.

At block 278, the above difference is divided by the time value 140a of FIG. 3, for example, by the divide circuit 138 of FIG. 3, resulting in the rotation speed signal 144a.

At block 262, if the rotation of the target object was not counterclockwise, then the process 250 proceeds to block 270, where an opposite of the prior angle value 132a of FIG. 3 is computed, for example, by the subtraction processor 136 of FIG. 3. As used herein, the opposite of an angle corresponds to an additive inverse of a value representing the angle. For example, an opposite of positive ten degrees is negative ten degrees. It will be understood that an additive inversion changes a sign of a value.

At block 272, it is computed, for example, by the subtraction processor 136, a difference between the opposite of the prior angle value 132a and the present angle value 128.

At block 274, the above difference is divided by the time value 140a of FIG. 3, for example, by the divide circuit 138 of FIG. 3, resulting in the rotation speed signal 144a.

At block 254, if no edge of the angle update clock signal 88a is detected, the process loops back to the beginning, waiting for an edge of the angle update clock signal 88a.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor for sensing a rotation of an object, comprising:
    a semiconductor substrate having first and second parallel major surfaces;
    a plurality of magnetic field sensing elements disposed upon the semiconductor substrate, wherein the plurality of magnetic field sensing elements is configured to generate a respective plurality of magnetic field sensing element output signals responsive to a magnetic field having a direction component in an x-y plane parallel to the first major surface of the semiconductor substrate, the x-y plane having an x-direction and a y-direction orthogonal to the x-direction;
    an x-y direction component circuit disposed upon the semiconductor substrate, coupled to receive a first intermediate signal representative of the plurality of magnetic field sensing element output signals, and configured to generate an x-y angle signal as a first output signal from the magnetic field sensor indicative of an angle of the direction component of the magnetic field in the x-y plane;
    a rotation speed sensing circuit disposed upon the semiconductor substrate, coupled to receive a signal representative of the x-y angle signal, and configured to generate a rotation speed signal as a second output signal from the magnetic field sensor indicative of a rotation speed of the object; and
    a power controller disposed upon the semiconductor substrate, coupled to receive the rotation speed signal, coupled to receive a velocity threshold value, configured to compare the rotation speed signal with the velocity threshold value, and configured to generate a velocity threshold mode control signal having first and second states in accordance with the comparing, wherein a continuous mode of operation is performed when the velocity threshold mode control signal is in the first state, and wherein a discontinuous mode of operation is performed when the velocity threshold mode control signal is in the second state, wherein, during the discontinuous mode of operation, a substantial portion of the magnetic field sensor periodically powers on and off, and wherein, when in the continuous mode of operation, the magnetic field sensor continually powers on.

2. The magnetic field sensor of claim 1, wherein the plurality of magnetic field sensing elements is arranged as a circular vertical Hall (CVH) structure, wherein each one of the plurality of magnetic field sensing element is a respective vertical Hall element of the CVH structure arranged upon a common circular implant region in the first major surface of the semiconductor substrate.

3. The magnetic field sensor of claim 1, further comprising a plurality of non-volatile memory registers disposed upon the semiconductor substrate, configured to store a present angle value derived from the x-y angle signal at a first time and configured to store a prior angle value derived from the x-y angle signal at a second time prior to the first time.

4. The magnetic field sensor of claim 3, wherein the rotation speed sensing circuit comprises:
    a subtraction circuit coupled to receive the present angle value, coupled to receive the prior angle value, and configured to compute a difference between a value representative of the present angle value and a value representative of the prior angle value to generate a difference value.

5. The magnetic field sensor of claim 4, wherein the rotation speed sensing circuit further comprises:
    a divide circuit coupled to receive the difference value, coupled to receive a time value, and configured to divide the difference value by the time value to generate the rotation speed signal.

6. The magnetic field sensor of claim 5, further comprising:
    a non-volatile power control prior angle register disposed upon the semiconductor substrate and configured to store a power control prior angle value derived from the x-y angle signal, wherein the power control prior angle value is representative of a value of the x-y angle signal at a last power down of the magnetic field sensor; and
    a direction detector circuit disposed upon the semiconductor substrate, coupled to receive the present angle value, coupled to receive the power control prior angle value, and configured to compare the present angle value with the power control prior angle value to generate a direction signal as a third output signal from the magnetic field sensor indicative of a direction of rotation of the object.

7. The magnetic field sensor of claim 6, further comprising:
a zero and one hundred eighty degrees detector circuit disposed upon the semiconductor substrate, coupled to receive the present angle value, coupled to receive the power control prior angle value, and configured to compare the present angle value with the power control prior angle value to generate a crossing signal at least indicative of the object rotating across zero degrees.

8. The magnetic field sensor of claim 7, further comprising:
a turns counter circuit disposed upon the semiconductor substrate, coupled to receive the direction signal, coupled to receive the crossing signal, configured to use the direction signal and the crossing signal to generate a turns count signal as a fourth output signal from the magnetic field sensor indicative of a count of a number of rotations of the object, wherein the count of the number of rotations is derived by adding rotations of the object that occur in a first direction and subtracting rotations of the object that occur in a second different direction.

9. The magnetic field sensor of claim 7, wherein the subtraction circuit is also coupled to receive the direction signal and the crossing signal, and the subtraction circuit is configured to use at least one of the direction signal or the crossing signal to identify if at least one of the present angle value or the prior angle value should be inverted to generate either the value representative of the present angle value by inverting the present angle value or to generate the value representative of the prior angle value by inverting the prior angle value, wherein the inverting the present angle value corresponds to changing a sign of the present angle value and wherein the inverting the prior angle value corresponds to changing a sign of the prior angle value.

10. The magnetic field sensor of claim 2, wherein the x-y direction component processor comprises:
a bandpass filter coupled to receive a second intermediate signal representative of the plurality of magnetic field sensing element output signals and configured to generate a filtered signal; and
a counting circuit coupled to receive the filtered signal, coupled to receive a clock signal, and configured to compare a phase of the clock signal with a phase of the filtered signal to provide the x-y angle signal.

11. The magnetic field sensor of claim 10, wherein the filtered signal comprises an AC signal component having a phase responsive to the angle of the direction component of the magnetic field in the x-y plane.

12. The magnetic field sensor of claim 1, further comprising a power control circuit disposed on the semiconductor substrate, the power control circuit comprising:
a timer configured to generate a timing signal having first and second states, wherein, when in the discontinuous mode of operation, the magnetic field sensor is operable to power up the substantial portion of the magnetic field sensor in response to the first state of the timing signal and to power down the substantial portion in response to the second state of the timing signal.

13. The magnetic field sensor of claim 12, wherein the power control circuit further comprises a gate coupled to receive the timing signal, coupled to receive the velocity threshold mode control signal, and configured to power up the substantial portion of the magnetic field sensor if the timing signal is in the first state while the velocity threshold mode control signal is in the first state.

14. The magnetic field sensor of claim 2, wherein the plurality of vertical Hall elements is driven and processed in a plurality of combinations, each combination comprising a different group of vertical Hall elements, each group of vertical Hall elements having a predetermined number of vertical Hall elements.

15. The magnetic field sensor of claim 14, wherein each group of vertical Hall elements is multiplexed, wherein a different one of each group of vertical Hall elements is coupled to receive a respective current at a different time.

16. The magnetic field sensor of claim 1, further comprising a plurality of non-volatile memory registers disposed upon the semiconductor substrate, configured to store a present angle value derived from the x-y angle signal at a first time and configured to store a prior angle value derived from the x-y angle signal at a second time prior to the first time, wherein, for a time period between the first time and the second time, the magnetic field sensor is operable to power off the substantial portion of the magnetic field sensor in the discontinuous mode of operation.

17. A method used in a magnetic field sensor, comprising:
generating, in the magnetic field sensor, a plurality magnetic field sensing element output signals with a corresponding plurality of magnetic field sensing elements disposed upon a semiconductor substrate, wherein the plurality of magnetic field sensing element output signals is responsive to a magnetic field having a direction component in an x-y plane parallel to the first major surface of the semiconductor substrate, the x-y plane having an x-direction and a y-direction orthogonal to the x-direction;
generating, in the magnetic field sensor, an x-y angle signal as a first output signal from the magnetic field sensor indicative of an angle of the direction component in the x-y plane in response to a first intermediate signal representative of the plurality of magnetic field sensing element output signals;
generating, in the magnetic field sensor, a rotation speed signal as a second output signal from the magnetic field sensor indicative of a rotation speed of the object in response to a signal representative of the x-y angle signal;
comparing, in the magnetic field sensor, the rotation speed signal with a velocity threshold value; and
generating, in the magnetic field sensor, a velocity threshold mode control signal having first and second states in accordance with the comparing the rotation speed signal with the velocity threshold value, wherein a continuous mode of operation is performed when the velocity is performed when the velocity threshold mode control signal is in the second state, wherein, during the discontinuous mode of operation, a substantial portion of the magnetic field sensor periodically powers on and off, and wherein, when in the continuous mode of operation, the magnetic field sensor continually powers on.

18. The method of claim 17, wherein the plurality of magnetic field sensing elements is arranged as a circular vertical Hall (CVH) structure, wherein each one of the plurality of magnetic field sensing elements is a respective vertical Hall element of the CVH structure arranged upon a common circular implant region in the first major surface of the semiconductor substrate.

19. The method of claim 17, further comprising:
storing, in the magnetic field sensor in a first non-volatile memory register, a present angle value derived from the x-y angle signal at a first time; and storing, in the magnetic field sensor, in a second non-volatile memory register, a prior angle value derived from the x-y angle signal at a second time prior to the first time.

20. The method of claim 19, wherein the generating the rotation speed signal comprises:
computing a difference between a value representative of the present angle value and a value representative of the prior angle value to generate a difference value.

21. The method of claim 20, wherein the generating the rotation speed signal further comprises:
dividing the difference value by a time value to generate the rotation speed signal.

22. The method of claim 21, further comprising:
storing, in a non-volatile memory device, a power control prior angle value derived from the x-y angle signal, wherein the power control prior angle value is representative of a value of the x-y angle signal at a time of a last power down of the magnetic field sensor; and
comparing, in the magnetic field sensor, the present angle value with the power control prior angle value to generate a direction signal as a third output signal from the magnetic field sensor indicative of a direction of rotation of the object.

23. The method of claim 22, further comprising:
comparing, in the magnetic field sensor, the present angle value with the power control prior angle value to generate a crossing signal at least indicative of the object rotating across zero degrees.

24. The method of claim 23, further comprising:
using, in the magnetic field sensor, the direction signal and the crossing signal to generate a turns count signal as a fourth output signal from the magnetic field sensor indicative of a count of a number of rotations of the object, wherein the count of the number of rotations is derived by adding rotations of the object that occur in a first direction and subtracting rotations of the object that occur in a second different direction.

25. The method of claim 23, wherein the computing the difference comprises:
using, in the magnetic field sensor, at least one of the direction signal or the crossing signal to identify if at least one of the present angle value or the prior angle value should be inverted to generate either the value representative of the present angle value by inverting the present angle value or to generate the value representative of the prior angle value by inverting the prior angle value, wherein the inverting the present angle value corresponds to changing a sign of the present angle value and wherein the inverting the prior angle value corresponds to changing a sign of the prior angle value.

26. The method of claim 18, wherein the generating the x-y angle signal comprises:
filtering a second intermediate signal representative of the plurality of magnetic field sensing element output signals to generate a filtered signal; and
comparing a phase of a clock signal with a phase of the filtered signal to provide the x-y angle signal.

27. The method of claim 26, wherein the filtered signal comprises an AC signal component having a phase responsive to the angle of the direction component of the magnetic field in the x-y plane.

28. The method of claim 17, further comprising:
generating, in the magnetic field sensor, a timing signal having first and second states, wherein, when the discontinuous mode of operation, the magnetic field sensor is operable to power up the substantial portion of the magnetic field sensor in response to the first state of the timing signal and to power down the substantial portion in response to the second state of the timing signal.

29. The method of claim 28, further comprising:
powering up the substantial portion of the magnetic field sensor if the timing signal is in the first state while the velocity threshold mode control signal is in the first state.

30. The method of claim 17, further comprising:
in a plurality of non-volatile memory registers, storing a present angle value derived from the x-y angle signal at a first time and storing a prior angle value derived from the x-y angle signal at a second time prior to the first time; and
for a time period between the first time and the second time, powering off a substantial portion of the magnetic field sensor in the discontinuous mode of operation.

31. A magnetic field sensor for sensing a rotation of an object, comprising:
a power control circuit disposed on a semiconductor substrate, the power control circuit comprising:
a timer configured to generate a timing signal having first and second states, wherein a portion of the magnetic field sensor powers up in response to the first state of the timing signal and powers down in response to the second state of the timing signal corresponding to a discontinuous mode of operation; and
a power controller disposed upon the semiconductor substrate, coupled to receive a rotation speed signal indicative of a rotation speed of the object, coupled to receive a velocity threshold value, configured to compare the rotation speed signal with the velocity threshold value, and configured to generate a velocity threshold mode control signal having first and second states in accordance with the comparing, wherein the first state of the velocity threshold control signal results in the magnetic field sensor being in the continuous mode of operation in which the portion of the magnetic field sensor is continuously powered on, and wherein the second state of the velocity threshold control signal results in the portion of the magnetic field sensor being controlled by the timing signal in the discontinuous mode of operation.

* * * * *

UNITED STATES PATENT AND TRADEMARK OFFICE
CERTIFICATE OF CORRECTION

PATENT NO.         : 8,729,890 B2
APPLICATION NO.    : 13/084745
DATED              : May 20, 2014
INVENTOR(S)        : Mark J. Donovan et al.

It is certified that error appears in the above-identified patent and that said Letters Patent is hereby corrected as shown below:

In the specification

Column 2, line 56 delete "plurality magnetic" and replace with --plurality of magnetic--.

Column 3, line 39 delete "rotation's" and replace with --rotation--.

Column 3, line 41 delete "an" and replace with --and--.

Column 8, line 25 delete ", and angle" and replace with --, an angle--.

Column 8, line 32 delete "is" and replace with --in--.

Column 8, line 36 delete "parameter" and replace with --parameters--.

Column 9, line 32 delete "138 a" and replace with --138a--.

Column 10, line 3 delete "value 128 and 128 and coupled" and replace with --value 128 and coupled--.

Column 10, line 46 delete "cycled" and replace with --be cycled--.

Column 10, line 47 delete "above-descried" and replace with --above-described--.

Column 10, line 50 delete "above-descried" and replace with --above-described--.

Column 11, line 36 delete "any either" and replace with --either--.

Column 11, line 54 delete "cross" and replace with --crossed--.

Signed and Sealed this
Sixth Day of October, 2015

Michelle K. Lee
*Director of the United States Patent and Trademark Office*

CERTIFICATE OF CORRECTION (continued)
U.S. Pat. No. 8,729,890 B2

Column 13, line 14 delete "were" and replace with --where--.

Column 13, line 16 delete "power" and replace with --powered--.

Column 13, lines 53-54 delete "determined 222," and replace with --determined--.

Column 14, line 6 delete ", in" and replace with --, and--.

Column 14, line 17 delete "to condition" and replace with --to a condition--.

Column 14, line 30 delete "to condition" and replace with --to a condition--.

Column 14, line 51 delete "value" and replace with --value.--.

Column 15, line 46 delete "that that" and replace with --that the--.

In the claims

Column 18, lines 23-24 delete "plurality magnetic" and replace with --plurality of magnetic--.

Column 18, lines 50-52 delete "velocity is performed when the velocity" and replace with --velocity--.